US008779881B2

(12) United States Patent
Gramegna (10) Patent No.: US 8,779,881 B2
(45) Date of Patent: Jul. 15, 2014

(54) VARYING INDUCTANCE

(71) Applicant: Cambridge Silicon Radio Limited, Cambridge (GB)

(72) Inventor: Giuseppe Gramegna, Golfe Juan (FR)

(73) Assignee: Cambridge Silicon Radio Limited, Cambridge (GB)

( * ) Notice: Subject to any disclaimer, the term of this patent is extended or adjusted under 35 U.S.C. 154(b) by 0 days.

(21) Appl. No.: 13/624,843

(22) Filed: Sep. 21, 2012

(65) Prior Publication Data

US 2014/0085027 A1    Mar. 27, 2014

(51) Int. Cl.
| H01F 29/02 | (2006.01) |
| H01F 21/02 | (2006.01) |
| H01F 30/14 | (2006.01) |
| H01F 27/28 | (2006.01) |

(52) U.S. Cl.
USPC .............. 336/143; 336/10; 336/146; 336/232

(58) Field of Classification Search
USPC ............ 336/143–150, 138, 232, 10; 307/113, 307/141.8, 115; 361/189, 628, 631
See application file for complete search history.

(56) References Cited

U.S. PATENT DOCUMENTS

| 3,452,311 A | 6/1969 | Beck et al. | |
| 5,650,726 A * | 7/1997 | Gasnier et al. | 324/339 |
| 7,129,784 B2 * | 10/2006 | Bhatti et al. | 330/295 |
| 2004/0140528 A1 | 7/2004 | Kim et al. | |
| 2005/0068146 A1 | 3/2005 | Jessie | |
| 2006/0066431 A1 | 3/2006 | Anand et al. | |
| 2007/0052512 A1 | 3/2007 | Jeon et al. | |
| 2010/0148866 A1 * | 6/2010 | Lee et al. | 330/197 |

FOREIGN PATENT DOCUMENTS

| CN | 102306642 | 1/2012 |
| EP | 0773449 | 5/1997 |
| EP | 1770849 | 4/2007 |
| GB | 102148 | 10/1916 |
| GB | 257334 | 8/1926 |
| GB | 304891 | 1/1929 |

* cited by examiner

*Primary Examiner* — Alexander Talpalatski
*Assistant Examiner* — Mangtin Lian
(74) *Attorney, Agent, or Firm* — Pillsbury Winthrop Shaw Pittman LLP (57) ABSTRACT

The present application relates to circuitry having a plurality of inductors, each inductor having a first end and a second end; and a switching arrangement connected to the first end and to the second end of each of the plurality of inductors for routing a current via the inductors; wherein the switching arrangement is arranged to at least one of selectably prevent current from flowing through a subset of the plurality of inductors and select a current flow direction through one of the inductors relative to a current flow direction through at least one other of the inductors so as to vary an effective inductance that the plurality of inductors represents to the current.

10 Claims, 10 Drawing Sheets

VARYING INDUCTANCE

TECHNICAL FIELD

The present application relates to varying inductance in a system.

BACKGROUND OF THE INVENTION

Electronic communication devices such as mobile telephones, smart phones, laptop computers, tablet computers and personal digital assistants (PDAs) typically include means for communicating via one or more communications technologies, such as Bluetooth, Wireless Fidelity (WiFi), 3G, and 3GPP Long Term Evolution (LTE). Generally, increasing the number of technologies via which a device can communicate requires more space to be used within the device for circuitry needed for implementing the communication technologies.

For example, many devices include circuitry and components enabling them to communicate via WiFi, using the IEEE 802.11 set of standards. Communications under one of the IEEE 802.11 standards are made in the 2.4 to 2.5 GHz frequency band. Another of the standards operates in the 5 GHz frequency band. Previously, for a device to communicate under both of these standards, that device would require separate circuitry for each communications standard. The separate circuits are likely to take up valuable space in the device, and require additional components, which adds to the cost and complexity involved in manufacturing the device.

SUMMARY OF INVENTION

According to a first aspect of the invention, circuitry comprises a plurality of inductors, each inductor having a first end and a second end; and a switching arrangement connected to the first end and to the second end of each of the plurality of inductors for routing a current via the inductors; wherein the switching arrangement is arranged to at least one of selectively prevent current from flowing through a subset of the plurality of inductors and select a current flow direction through one of the inductors relative to a current flow direction through at least one other of the inductors so as to vary an effective inductance that the plurality of inductors represents to the current. By arranging the circuitry in this way, Two of the inductors in the plurality may be conductors shaped as arches and the arches are nested one inside the other. Each arch may have two parallel straight sides joined by a straight section.

The switching arrangement may comprise a plurality of transistors that are configurable to select how the plurality of inductors connect to a source of the current.

The plurality of inductors may comprise a first inductor and a second inductor. The switching arrangement may comprises a first pair of switches having a first switch connected to the first end of the first inductor and a second switch connected to the second end of the first inductor; a second pair of switches having a third switch connected to the first end of the second inductor and a fourth switch connected to the second end of the second inductor; a third pair of switches having a fifth switch connected to the first end of the first inductor and a sixth switch connected to the second end of the first inductor; and a fourth pair of switches having a seventh switch connected to the first end of the second inductor and an eighth switch connected to the second end of the second inductor.

The circuitry may be arrange such that, when the first pair of switches and the second pair of switches are closed, and the third pair of switches and the fourth pair of switches are open, a current is able to flow through the first inductor in a first direction and through the second inductor in said first direction.

The circuitry may be arrange such that, when the first pair of switches and the fourth pair of switches are closed, and the second pair of switches and the third pair of switches are open, a current is able to flow through the first inductor in a first direction and through the second inductor in a second direction opposite to the first direction.

The circuitry may be arrange such that, when the first pair of switches are closed, and the second pair of switches, the third pair of switches and the fourth pair of switches are open, a current is able to flow through the first inductor in a first direction and no current is able to flow through the second inductor.

The circuitry may be arrange such that, when the second pair of switches are closed, and the first pair of switches, the third pair of switches and the fourth pair of switches are open, a current is able to flow through the second inductor in a first direction and no current is able to flow through the first inductor.

The first, second, third, fourth, fifth, sixth, seventh and eighth switches may be transistors.

According to a second aspect of the invention, an integrated circuit comprises the circuitry described herein.

BRIEF DESCRIPTION OF THE DRAWINGS

Embodiments of the invention will now be described, strictly by way of example only, with reference to the accompanying drawings, of which.

DESCRIPTION OF THE EMBODIMENTS

Referring to the drawings, FIGS. 1 to 4 show various arrangements of a pair of inductors used to implement the present invention. A first (primary) inductor $L_P$ is shown coupled electromagnetically to a second (secondary) inductor $L_S$ with a coupling factor k. In FIGS. 1 to 4, $I_{in}$ denotes an input current provided to the inductors, and $I_{out}$ denotes a current output from the inductors.

Figure 1:
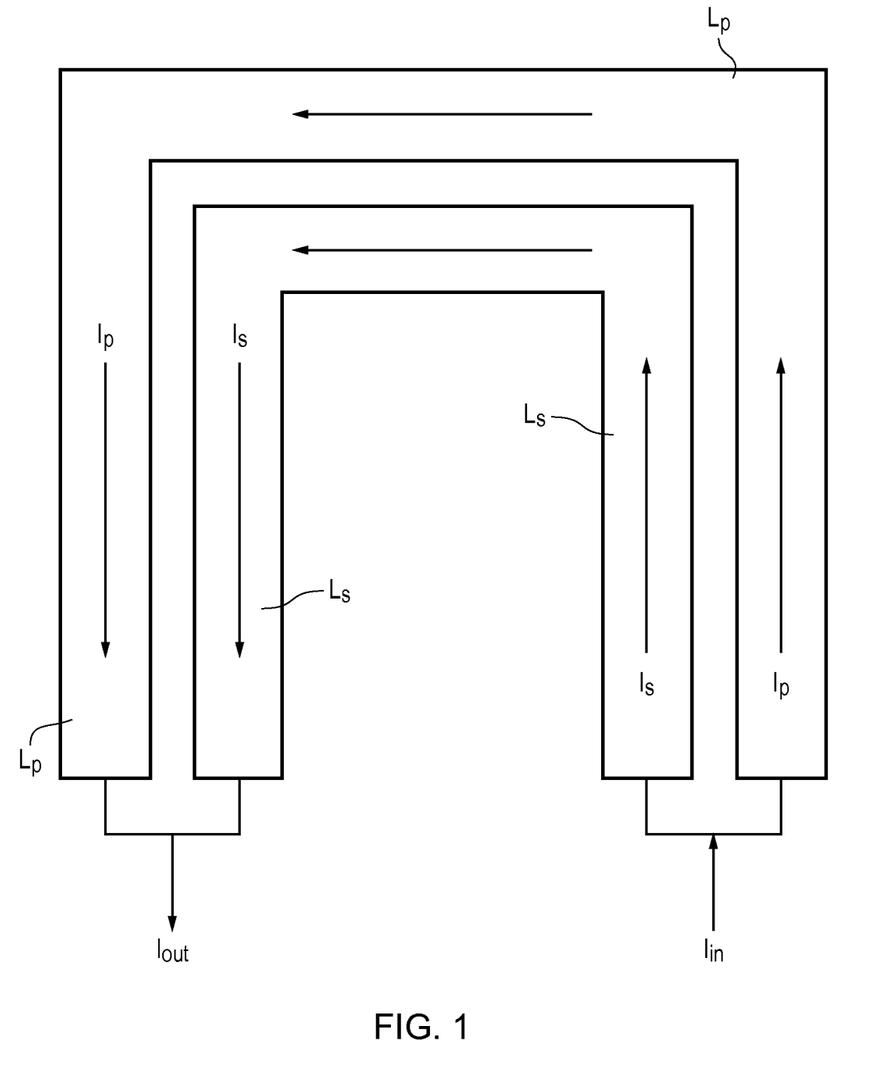
FIG. 1 is a schematic view of an arrangement of two inductors in a first configuration.

In FIG. 1, the primary inductor $L_P$ and the secondary inductor $L_S$ are connected in parallel, such that, when the inductors are connected to a current source (not shown), a current $I_P$ flows through the primary inductor in the same direction as a current $I_S$ flowing through the secondary inductor. The directions of the flow of current in each of the inductors is shown by arrows. In this arrangement, the mutual inductance between the inductors is positive.

Figure 2:
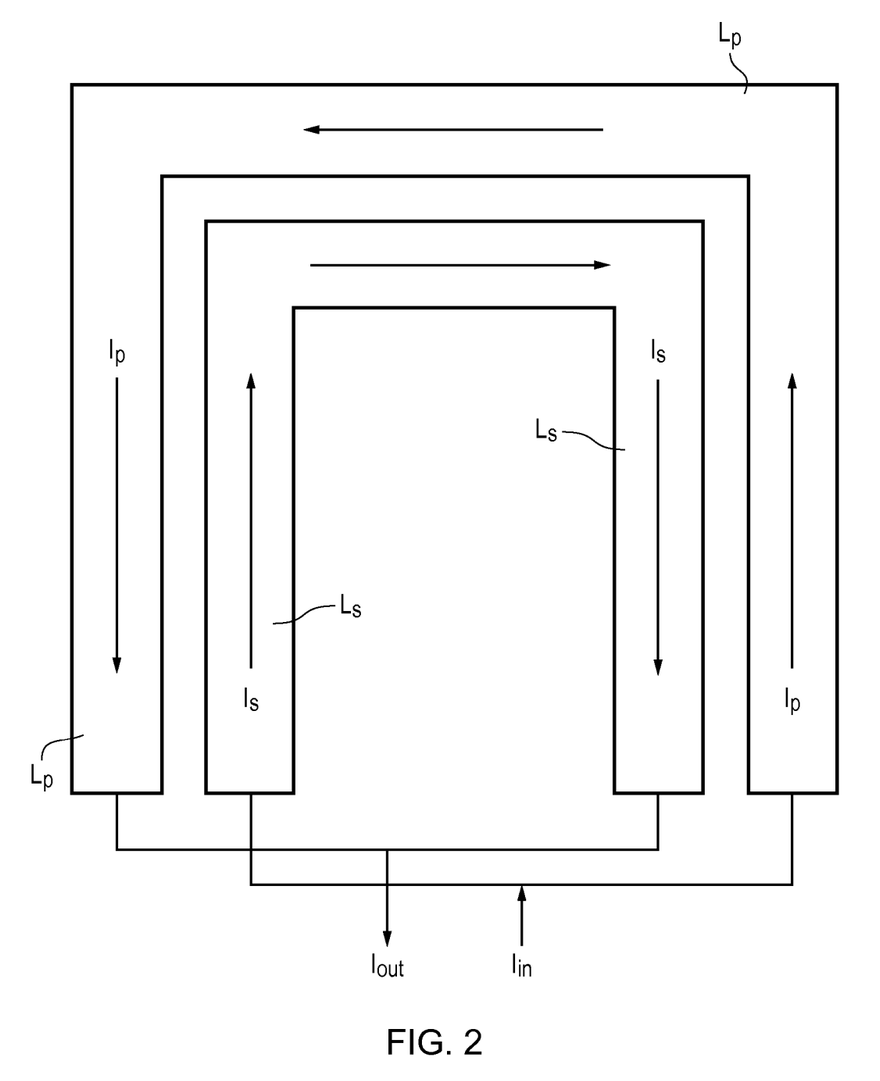
FIG. 2 is a schematic view of an arrangement of two inductors in a second configuration.

In FIG. 2, the primary inductor $L_P$ and the secondary inductor $L_S$ are again connected in parallel, but this time such that a current $I_P$ flows through the primary inductor in an opposite direction to a current $I_S$ flowing through the secondary inductor. In this arrangement, the mutual inductance between the inductors is equal in magnitude to that of the arrangement of FIG. 1, but is negative.

Figure 3:
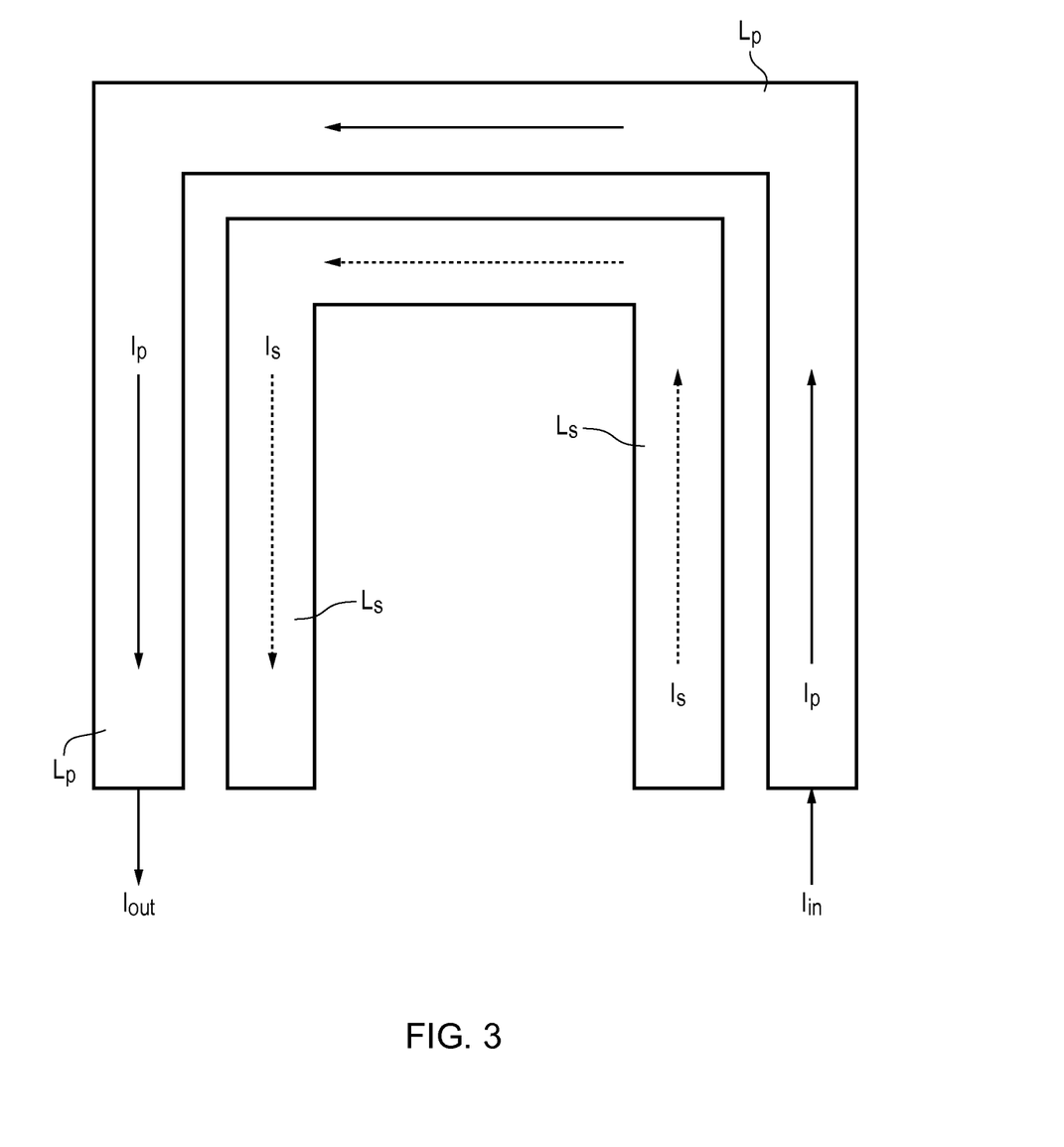
FIG. 3 is a schematic view of an arrangement of two inductors in a third configuration.

In FIG. 3, the primary inductor $L_P$ is connected to a current source (not shown), and the secondary inductor $L_S$ is unconnected (denoted by the dashed arrow). Therefore, a current $I_P$ flows through the primary inductor $L_P$, and no current flows through the secondary inductor $L_S$. Since, in this arrangement, no current flows in the secondary inductor $L_S$, the mutual inductance does not affect the performance of the primary inductor $L_P$.

Figure 4:
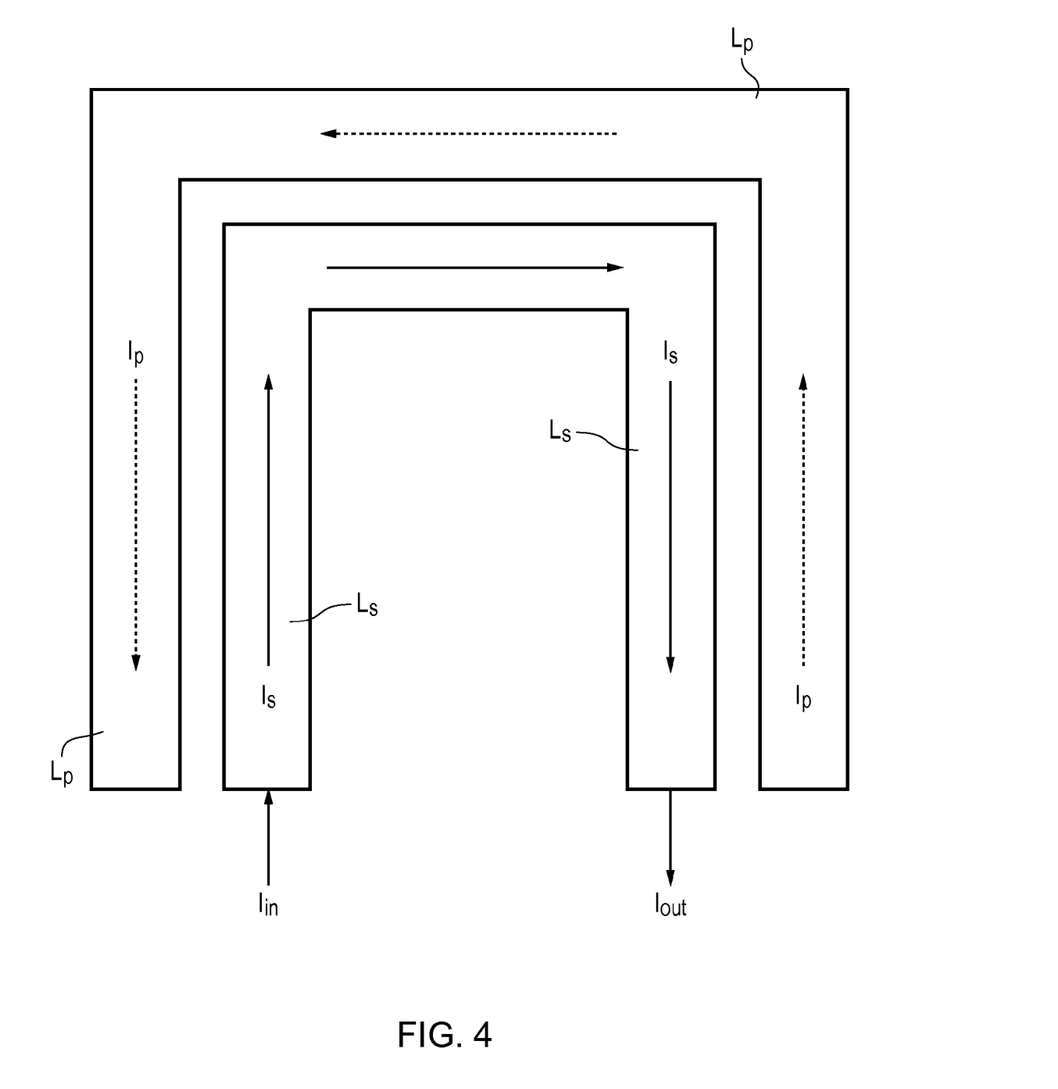
FIG. 4 is a schematic view of an arrangement of two inductors in a fourth configuration.

In FIG. 4, the secondary inductor $L_S$ is connected to a current source (not shown), and the primary inductor $L_P$ is unconnected (denoted by the dashed arrow). Therefore, a current $I_S$ flows through the secondary inductor $L_S$, and no current flows through the primary inductor $L_P$. Since, in this arrangement, no current flows in the primary inductor $L_P$, the mutual inductance does not affect the performance of the secondary inductor $L_S$.

In each of the cases shown in FIGS. 1 to 4, an equivalent inductance, $L_{eq}$, can be used to represent the combined effect of the two interacting inductors $L_P$ and $L_S$. The equivalent inductance $L_{eq}$ differs from case to case as a function of the inductance of the inductors $L_P$, $L_S$, and as a function of the coupling factor k between them.

The relationship between the primary and secondary inductors $L_P$, $L_S$ can be written in terms of vectors as:

$$\begin{pmatrix} V_P \\ V_S \end{pmatrix} = s \begin{bmatrix} L_P & M \\ M & L_S \end{bmatrix} \cdot \begin{pmatrix} I_P \\ I_S \end{pmatrix} \quad [1]$$

where:
s is the Laplace variable and is equal to $j\omega$, where j is $\sqrt{-1}$ and $\omega$ is the frequency of the current that is applied to the inductors $L_P$, $L_S$.
the coupling factor is given by:

$$k = \frac{M}{\sqrt{L_P \cdot L_S}} \quad [2]$$

In a case such as in FIG. 1 or 2 where current flows in both inductors $L_P$, $L_S$, the equivalent inductance $L_{eq}$ is given by:

$$L_{eq} = \frac{L_P \cdot L_S \cdot (1-k^2)}{L_P + L_S - 2k\sqrt{L_P \cdot L_S}} \quad [3]$$

If one then assumes that $L_P = L_S$, the equivalent inductance $L_{eq}$ for either the FIG. 1 or the FIG. 2 arrangement is given by:

$$L_{eq} = L_P(1-k)/2 \quad [4]$$

If one assumes that there is a perfect coupling between $L_s$ and $L_p$ in FIG. 1 such that k=1, then, for the FIG. 1 arrangement:

$$L_{eq} = L_P \quad [5]$$

If one assumes that there is a perfect coupling between $L_s$ and $L_p$ in FIG. 2 such that k=−1, then, for the FIG. 2 arrangement:

$$L_{eq} = 0 \quad [6]$$

It will be apparent to persons skilled in inductor and transformer design that the modulus of the coupling factor |k|, describes the extent to which the inductors $L_s$ and $L_p$ affect each other and that the sign of k reflects the sense in which the currents travel; that is to say, k is positive when the currents are in the same direction and k is negative when the currents are in opposite directions.

For the arrangement shown in FIG. 3, where current flows only through the primary inductor $L_P$, the equivalent inductance $L_{eq} = L_P$. Similarly, for the arrangement shown in FIG. 4, where the current flows only through the secondary inductor $L_S$, the equivalent inductance $L_{eq} = L_S$.

So far, we have discussed how varying the arrangement of the primary and secondary inductors $L_P$, $L_S$ can vary the equivalent inductance $L_{eq}$ resulting from the contribution of the inductors. FIGS. 5 to 9 show how a particular circuit arrangement according to one embodiment of the invention can be used to create the flow of current through the inductors in the arrangements discussed above in connection with FIGS. 1 to 4.

Figure 5:
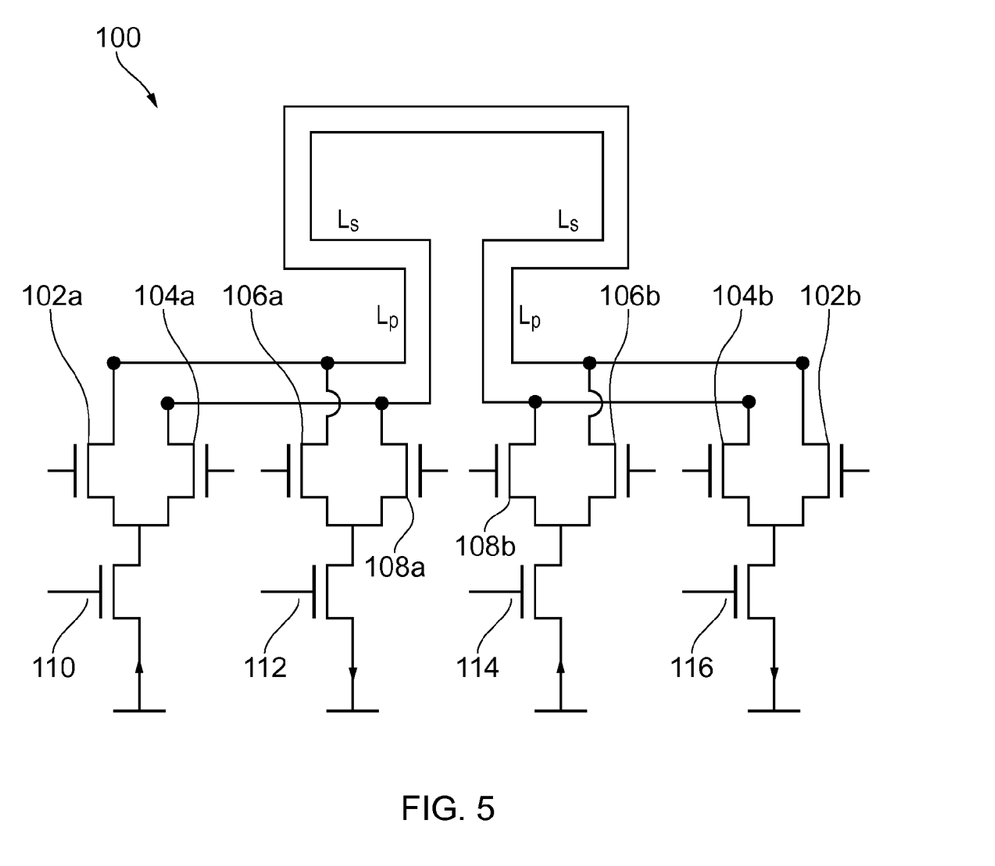
FIG. 5 is a circuit diagram of a circuit for implementing the present invention.

FIG. 5 shows a circuit arrangement 100 having the primary and secondary inductors $L_P$, $L_S$ connected in parallel to one another and connected to a switching arrangement. The primary inductor $L_P$ is connected to a pair of switches 102a, 102b and to a pair of switches 104a, 104b. The secondary inductor $L_S$ is connected to a pair of switches 106a, 106b and to a pair of switches 108a, 108b. The switches 102a, 102b, 104a, 104b, 106a, 106b, 108a, 108b are provided to permit (when closed) and/or to restrict or prevent (when open) the flow of current through a desired one or both of the inductors $L_P$, $L_S$.

Current flow to the switches 102a and 104a is permitted and/or restricted or prevented by a switch 110. Similarly, current flow to the switches 106a and 108a is permitted and/or restricted or prevented by a switch 112, current flow to the switches 106b and 108b is permitted and/or restricted or prevented by a switch 114 and current flow to the switches 102b and 104b is permitted and/or restricted or prevented by a switch 116. The switches 110 and 114 allow current to flow in a first direction 'into' the inductors, and the switches 112 and 116 allow current to flow in a second direction 'out of' the inductors. In other words, current flows into the inductors $L_P$, $L_S$ via the switches 110 and 114, and out of the inductors via the switches 112 and 116. Those skilled in the art will appreciate that the direction of flow through the switches could be reversed or varied.

In one embodiment, the switches 102a, 102b, 104a, 104b, 106a, 106b, 108a, 108b, 110, 112, 114, 116 are implemented by transistors in a manner known to those skilled in the art. Those skilled in the art will appreciate that the switches may alternatively be implemented in a different way. The switches may be controlled manually, electronically using hardware, or by software executed by a processor (not shown). When implemented using transistors, the switches 110, 112, 114, 116 are also capable of functioning as transconductance stages. At the same time, transistors 102a, 104a, 106a, 108a, 102b, 104b, 106b, 108b can be operated as cascade transistors.

By closing particular ones, and/or combinations, of the switches, a user can control which of the inductors $L_P$, $L_S$ current is able to flow through, and the direction in which the current is able to flow. FIGS. 6 to 9 show the combinations of switches necessary to obtain the configurations discussed above with reference to FIGS. 1 to 4.

Figure 6:
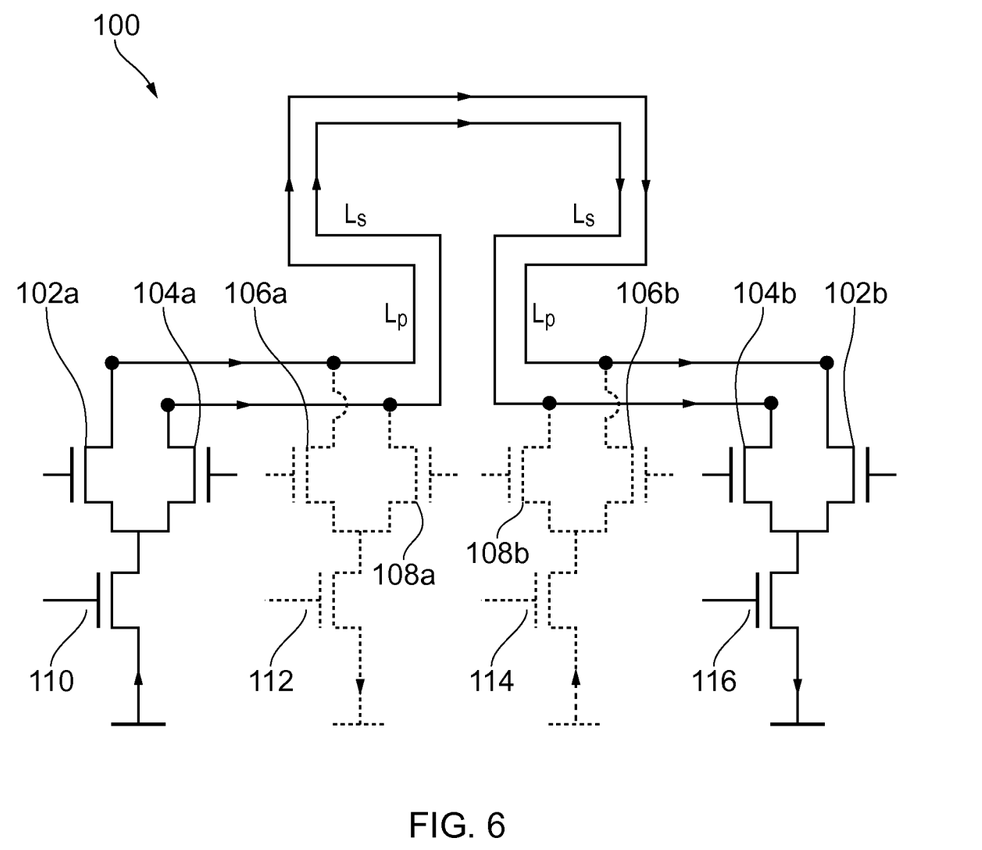
FIG. 6 shows a configuration of the circuit of FIG. 5 that implements the configuration shown in FIG. 1.

In FIG. 6, switches 102a, 104a, 102b, 104b, 110 and 116 are closed, and switches 106a, 108a, 106b, 108b, 112 and 114 are open. The open switches and the connections to the open switches are shown as dotted lines. Current is able to flow through the closed switch 110, and through the closed switches 102a and 104a into both the primary inductor $L_P$ and the secondary inductor $L_S$. From the inductors $L_P$, $L_S$, the current flows through the closed switches 102b and 104b, and through the closed switch 116. With this arrangement of closed switches, the current flows through both inductors in the same direction (in the direction of the arrows) and, therefore, the configuration described above with regard to FIG. 1 is achieved. Those skilled in the art will appreciate that the same configuration could be achieved by instead closing the switches 112, 106a, 108a, 106b, 108b and 114, and opening the other switches. In that arrangement, the current would flow through the primary and secondary inductors $L_P$ and $L_S$, but in a direction opposite to the arrows shown in FIG. 6.

Figure 7:
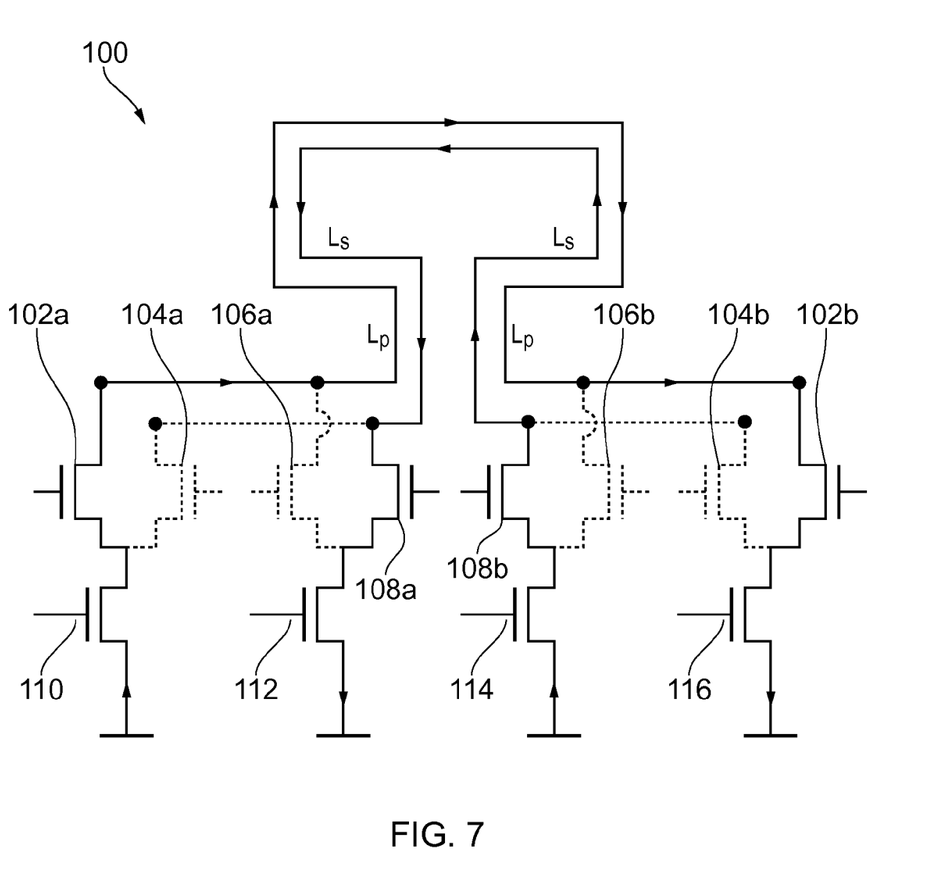
FIG. 7 shows a configuration of the circuit of FIG. 5 that implements the configuration shown in FIG. 2.

In FIG. 7, switches 102a, 108a, 102b, 108b, 110, 112, 114 and 116 are closed, and switches 104a, 106a, 104b and 106b are open. The open switches and the connections to the open switches are shown as dotted lines. Current is able to flow through the closed switch 110, and through the closed switch 102a into the primary inductor $L_P$. From the primary inductor $L_P$, the current flows through the closed switch 102b, and through the closed switch 116. Similarly, current is able to flow through the closed switch 114, and through the closed switch 108b into the secondary inductor $L_S$. From the secondary inductor $L_S$, the current flows through the closed switch 108a, and through the closed switch 112. With this arrangement of closed switches, the current flows through the primary inductor $L_P$ in an opposite direction to the current flowing through the secondary inductor $L_S$ and, therefore, the configuration described above with regard to FIG. 2 is achieved. Those skilled in the art will appreciate that the same configuration could be achieved by instead closing the switches 110, 112, 104a, 106a, 104b, 106b, 114 and 116, and opening the other switches. In that arrangement, the current would flow through the primary inductor $L_P$ in a direction opposite to that of the current flowing through them secondary inductor $L_S$, but in directions opposite to the arrows shown in FIG. 7.

Figure 8:
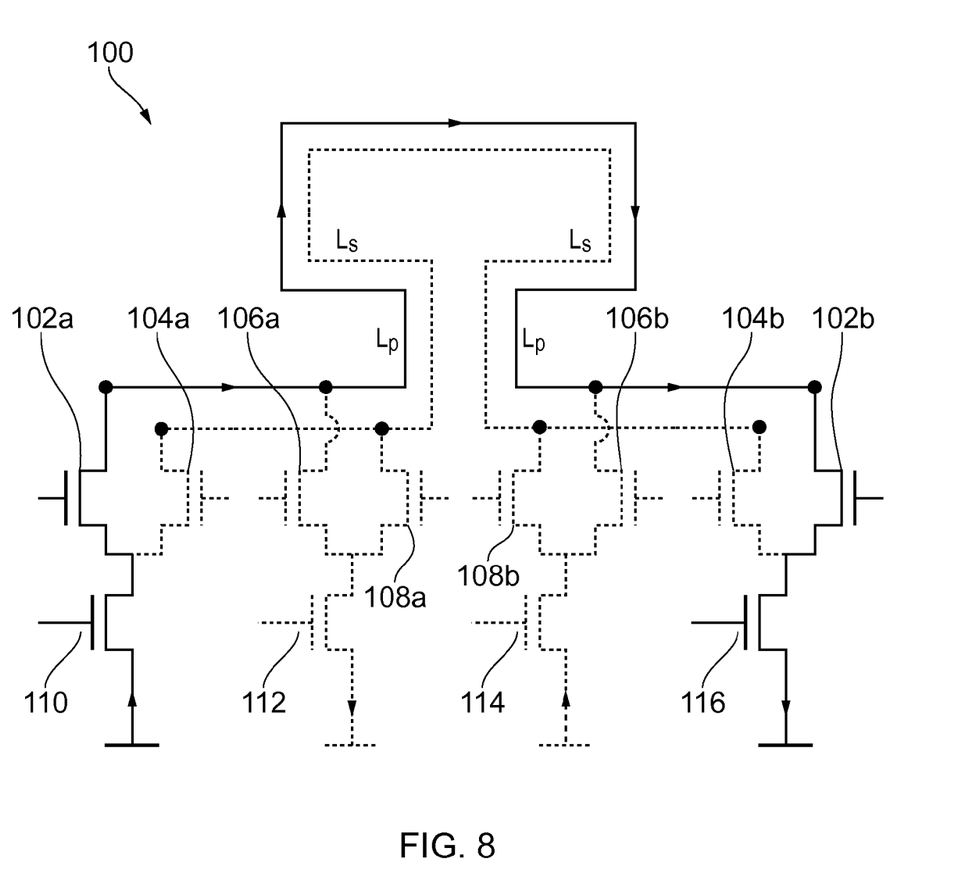
FIG. 8 shows a configuration of the circuit of FIG. 5 that implements the configuration shown in FIG. 3.

In FIG. 8, switches 102a, 102b, 110 and 116 are closed, and switches 104a, 106a, 108a, 104b, 106b, 108b, 112 and 114 are open. The open switches and the connections to the open switches are shown as dotted lines. Current is able to flow through the closed switch 110, and through the closed switch 102a into the primary inductor $L_P$. From the primary inductor $L_P$, the current flows through the closed switch 102b, and through the closed switch 116. With this arrangement of closed switches, the current flows only through the primary inductor $L_P$ and, therefore, the configuration described above with regard to FIG. 3 is achieved. Those skilled in the art will appreciate that the same configuration could be achieved by closing the switches 112, 106a, 106b and 114. In that arrangement, the current would flow only through the primary inductor $L_P$, but in a direction opposite to the arrows shown in FIG. 8.

Figure 9:
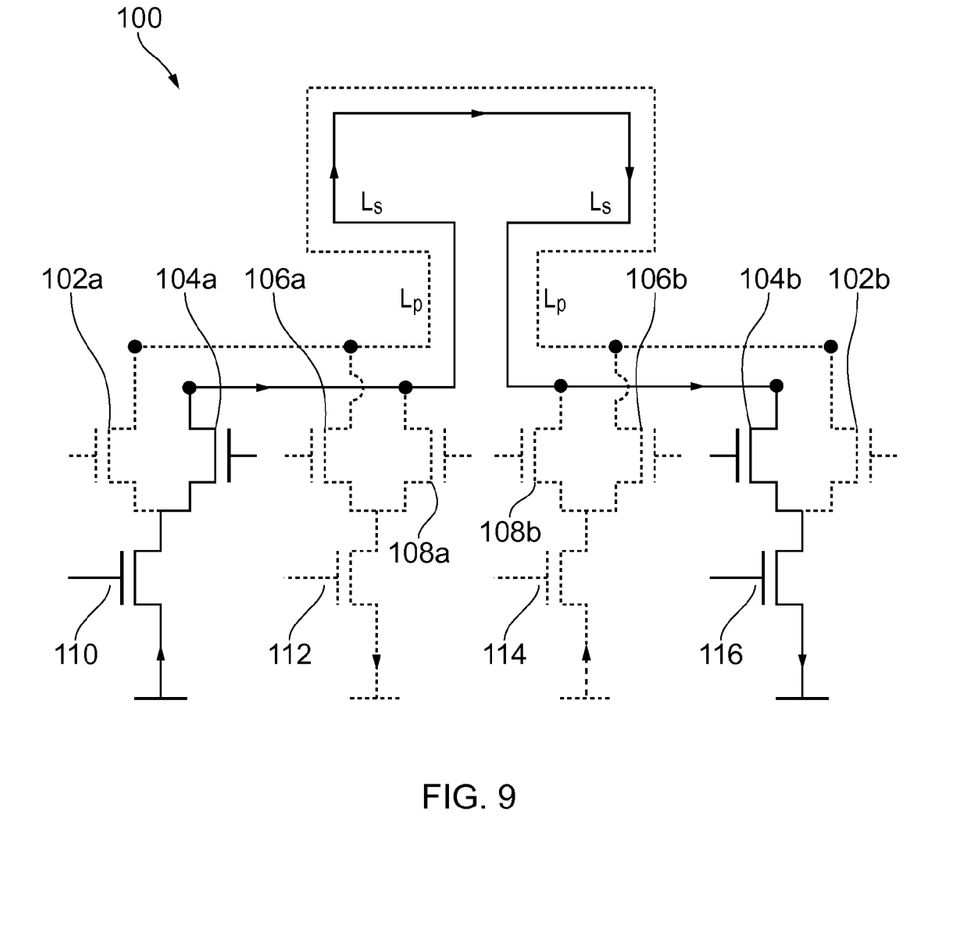
FIG. 9 shows a configuration of the circuit of FIG. 5 that implements the configuration shown in FIG. 4.

In FIG. 9, switches 104a, 104b, 110 and 116 are closed, and switches 102a, 106a, 108a, 102b, 106b, 108b, 112 and 114 are open. The open switches and the connections to the open switches are shown as dotted lines. Current is able to flow through the closed switch 110, and through the closed switch 104a into the secondary inductor $L_S$. From the secondary inductor $L_S$, the current flows through the closed switch 104b, and through the closed switch 116. With this arrangement of closed switches, the current flows only through the secondary inductor $L_S$ and, therefore, the configuration described above with regard to FIG. 4 is achieved. Those skilled in the art will appreciate that the same configuration could be achieved by closing the switches 112, 108a, 108b and 114. In that arrangement, the current would flow only through the primary inductor $L_S$, but in a direction opposite to the arrows shown in FIG. 9.

Example

Figure 10:
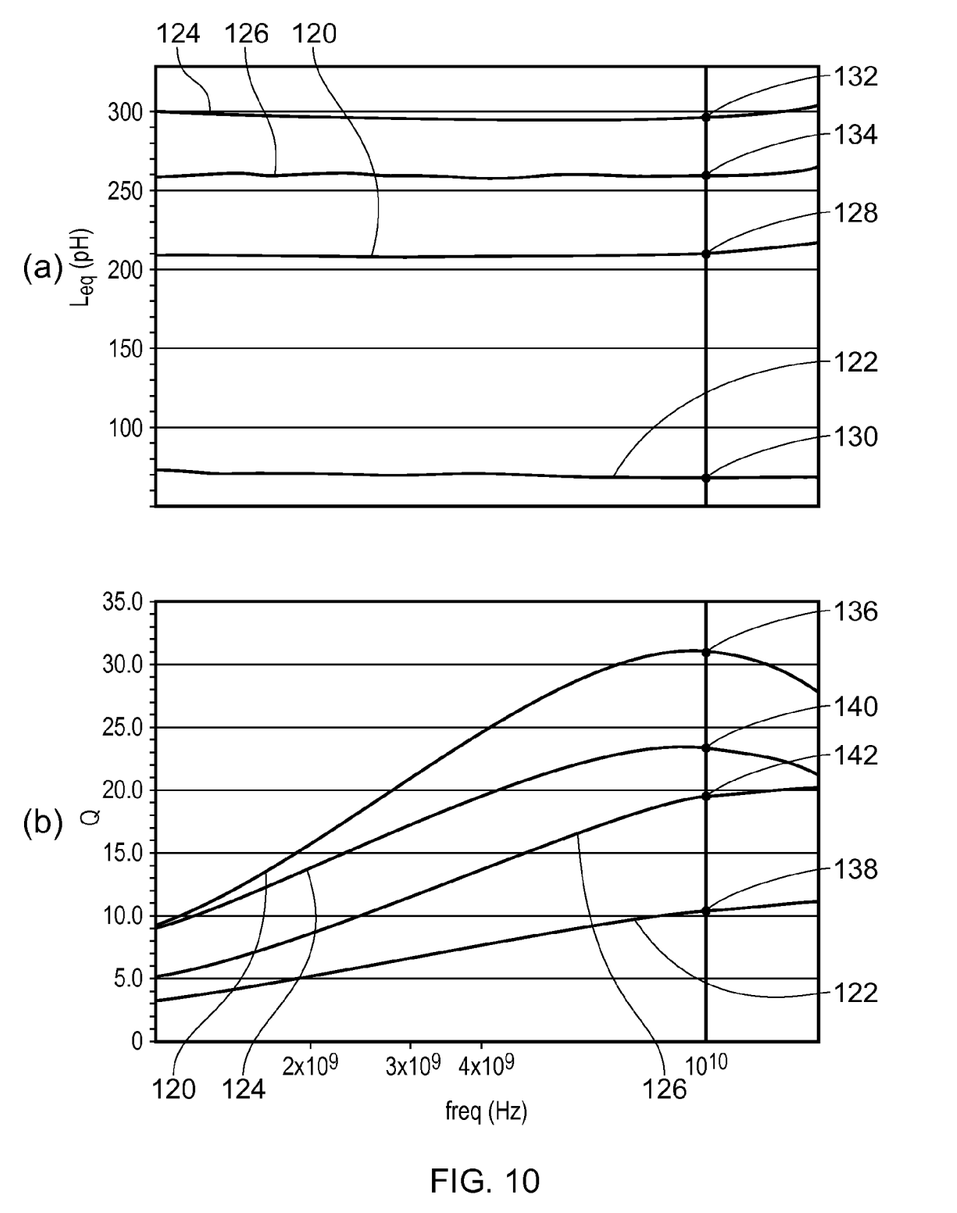
FIG. 10 is a graphical plot of results obtained through simulation for the configurations shown in FIGS. 6 to 9; plot (a) shows equivalent inductance as a function of frequency, and plot (b) shows quality factor as a function of frequency.

The four configurations described above can be simulated using a computer simulation programme. FIG. 10 shows, graphically, results of such a simulation using the following parameters:

Primary inductance, $L_P$=296 pH
Secondary inductance, $L_S$=259 pH
Coupling factor, k=0.52

Plot (a) shows the equivalent inductance, $L_{eq}$, as a function of the frequency, $f_0$, and plot (b) shows the quality factor, Q, as a function of the frequency $f_0$. The lines labeled 120 represent the configuration shown in FIG. 1, where the currents flow in a parallel direction. In plot (a), the configuration shown by line 120 has an equivalent inductance, $L_{eq}$, of 209.4 pH at a frequency of $10^{10}$ Hz (point 128). In plot (b), the configuration shown by line 120 has a quality factor, Q, of 32 at a frequency of $10^{10}$ Hz (point 136). The lines labeled 122 represent the configuration shown in FIG. 2, where the currents in the inductors flow in opposite directions. In plot (a), the configuration shown by line 122 has an equivalent inductance, $L_{eq}$, of 66.3 pH at a frequency of $10^{10}$ Hz (point 130). In plot (b), the configuration shown by line 122 has a quality factor, Q, of 10 at a frequency of $10^{10}$ Hz (point 138). The lines labeled 124 represent the configuration shown in FIG. 3, where a current flows only through the primary inductor $L_P$. In plot (a), the configuration shown by line 124 has an equivalent inductance, $L_{eq}$, of 295.9 pH at a frequency of $10^{10}$ Hz (point 132). In plot (b), the configuration shown by line 124 has a quality factor, Q, of 23 at a frequency of $10^{10}$ Hz (point 140). The lines labeled 126 represent the configuration shown in FIG. 4, where a current flows only through the secondary inductor $L_S$. In plot (a), the configuration shown by line 126 has an equivalent inductance, $L_{eq}$, of 259 pH at a frequency of $10^{10}$ Hz (point 134). In plot (b), the configuration shown by line 126 has a quality factor, Q, of 19 at a frequency of $10^{10}$ Hz (point 142).

The following table shows the simulated values for the equivalent inductance $L_{eq}$ at a frequency of $1 \times 10^{10}$ Hz for each of the configurations shown in FIGS. 1 to 4, alongside calculated values for the equivalent inductance $L_{eq}$ at a frequency of $1 \times 10^{10}$ Hz for each of those configurations.

| | Calculated Equivalent Inductance (pH) | Simulated Equivalent Inductance (pH) | Simulated Quality Factor, Q |
|---|---|---|---|
| Primary and secondary inductors driven with current flowing in same direction through | 209.4 | 209.4 | 31 |

-continued

|  | Calculated Equivalent Inductance (pH) | Simulated Equivalent Inductance (pH) | Simulated Quality Factor, Q |
|---|---|---|---|
| each (120 in FIG. 10) Primary and secondary inductors driven with current flowing in opposite directions (122 in FIG. 10) | 66.3 | 66.3 | 10 |
| Primary inductor driven only (124 in FIG. 10) | 290 | 295.9 | 23 |
| Secondary inductor driven only (126 in FIG. 10) | 250 | 259 | 19 |

It can be seen that, when the primary and secondary inductors $L_P$, $L_S$ are driven by currents flowing in opposite directions (line 122), the quality factor, Q, is greatly reduced as a result of the mutual inductance being reduced (but the actual physical resistance is unaffected). In contrast, in the configuration wherein the currents flow in the same direction (line 120), the Q factor is relatively high as a result of the mutual inductance being higher.

From the four configurations described above, it is possible to achieve a range in the equivalent inductance, $L_{eq}$, from around 60 pH to around 300 pH. Such a broad range is not achievable using conventional switches.

The invention may be implemented by various means which will be apparent to those skilled in the art. For example, in one embodiment, the invention is implemented using an integrated circuit on a chip. Some of the components may be controlled using software.

Those skilled in the art will appreciate that the invention may be implemented without the switches 110, 112, 114, 116. Similarly, it will be appreciated that, in other embodiments, the circuit 100 includes more than two inductors. Accordingly, in those embodiments, the circuit includes more switches to allow or restrict current flow to the inductors.

So far, the invention has been described in terms of individual embodiments. However, one skilled in the art will appreciate that various embodiments of the invention, or features from one or more embodiments, may be combined as required. It will be appreciated that various modifications may be made to the embodiments described herein without departing from the scope of the invention, which is defined by the appended claims.

What is claimed is:

1. Circuitry comprising:
   a plurality of inductors, each inductor having a first end and a second end; and
   a switching arrangement connected to the first end and to the second end of each of the plurality of inductors for routing a current via the inductors;
   wherein the switching arrangement is arranged to at least one of:
   selectively prevent current from flowing through a subset of the plurality of inductors; and
   select a current flow direction through one of the inductors relative to a current flow direction through at least one other of the inductors so as to vary an effective inductance that the plurality of inductors represents to the current
   wherein the plurality of inductors comprises a first inductor and a second inductor, and wherein the switching arrangement comprises:
   a first pair of switches having a first switch connected to the first end of the first inductor and a second switch connected to the second end of the first inductor;
   a second pair of switches having a third switch connected to the first end of the second inductor and a fourth switch connected to the second end of the second inductor;
   a third pair of switches having a fifth switch connected to the first end of the first inductor and a sixth switch connected to the second end of the first inductor; and
   a fourth pair of switches having a seventh switch connected to the first end of the second inductor and an eighth switch connected to the second end of the second inductor.

2. Circuitry according to claim 1, wherein two of the inductors in the plurality are conductors shaped as arches and the arches are nested one inside the other.

3. Circuitry according to claim 2, wherein each arch has two parallel straight sides joined by a straight section.

4. Circuitry according to claim 1, wherein the switching arrangement comprises a plurality of transistors that are configurable to select how the plurality of inductors connect to a source of the current.

5. Circuitry according to claim 1, wherein, when the first pair of switches and the second pair of switches are closed, and the third pair of switches and the fourth pair of switches are open, a current is able to flow through the first inductor in a first direction and through the second inductor in said first direction.

6. Circuitry according to claim 1, wherein when the first pair of switches and the fourth pair of switches are closed, and the second pair of switches and the third pair of switches are open, a current is able to flow through the first inductor in a first direction and through the second inductor in a second direction opposite to the first direction.

7. Circuitry according to claim 1, wherein when the first pair of switches are closed, and the second pair of switches, the third pair of switches and the fourth pair of switches are open, a current is able to flow through the first inductor in a first direction and no current is able to flow through the second inductor.

8. Circuitry according to claim 1, wherein when the second pair of switches are closed, and the first pair of switches, the third pair of switches and the fourth pair of switches are open, a current is able to flow through the second inductor in a first direction and no current is able to flow through the first inductor.

9. Circuitry according to claim 1, wherein the first, second, third, fourth, fifth, sixth, seventh and eighth switches are transistors.

10. An integrated circuit comprising the circuitry of claim 1.

* * * * *